United States Patent [19]

Penn

[11] 3,898,080

[45] Aug. 5, 1975

[54] GERMANIUM-SILICON THERMOELECTRIC ELEMENTS

[75] Inventor: Alan William Penn, Reading, England

[73] Assignee: United Kingdom Atomic Energy Authority, London, England

[22] Filed: Apr. 3, 1972

[21] Appl. No.: 240,861

Related U.S. Application Data

[63] Continuation of Ser. No. 822,353, May 7, 1969, abandoned.

[30] Foreign Application Priority Data

May 14, 1968 United Kingdom ............... 22948/68

[52] U.S. Cl. ............. 75/134 S; 75/134 G; 136/239; 252/62.3 T

[51] Int. Cl. ............................................ C22c 31/00

[58] Field of Search ....................... 75/134 G, 134 S; 252/62.3 T; 136/239

[56] References Cited

UNITED STATES PATENTS

| | | | |
|---|---|---|---|
| 3,279,954 | 10/1966 | Cody et al. | 136/205 |
| 3,285,017 | 11/1966 | Henderson et al. | 252/62.3 T X |
| 3,508,915 | 4/1970 | Paoli | 75/135 |
| 3,524,771 | 8/1970 | Green | 252/62.3 T X |

*Primary Examiner*—L. Dewayne Rutledge
*Assistant Examiner*—E. L. Weise
*Attorney, Agent, or Firm*—Larson, Taylor and Hinds

[57] ABSTRACT

The thermal conductivity of doped germanium/silicon alloy thermo-electric material is reduced, without corresponding reduction of electrical conductivity, by a process of manufacture which results in a fine grain structure, or, more significantly, as low characteristic scattering length as possible in the range 0.01 microns to 10 microns.

4 Claims, No Drawings

GERMANIUM-SILICON THERMOELECTRIC ELEMENTS

This is a continuation of application Ser. No. 822,353 filed May 7, 1969 now abandoned.

BACKGROUND OF THE INVENTION

The invention relates to thermoelectric elements and their manufacture.

For the direct conversion of thermal into electrical energy, or for the converse process of producing a refrigerating effect by appropriate passage of electric current through a thermopile, thermoelectric modules are formed from a series of bars or rods of thermoelectric material which form the individual thermocouple members and which are arranged side by side. The thermocouple members are held together in their array, and are electrically insulated from one another, for example, by intervening thin layers of an encapsulating material such as an epoxy resin, or, where higher temperature operation is required, magnesium silicate. The ends of the thermocouple members are exposed and are electrically connected in pairs by metallic straps to form a series-connected arrangement.

In, for example, a radioisotope-powered thermoelectric generator, the two end surfaces of the module bearing the connecting straps are arranged in good thermal contact with, but electrically insulated from, a heat source and a heat sink.

It will be appreciated that it is desirable for the thermoelectric material to be such as produces as large a thermoelectric effect as possible (i.e. has a large Seebeck co-efficient), and to have low thermal conductivity combined with as good electrical conductivity as can be achieved. For facilitating the assessment of the thermoelectric effectiveness of a material in these respects, there is defined the thermoelectric figure of merit (Z), where $$Z = \frac{\alpha^2 \sigma}{K}$$

$\alpha$ is the Seebeck coefficient, $\sigma$ the electrical conductivity and K the thermal conductivity.

Examples of thermoelectric materials having comparatively high thermoelectric figures of merit are appropriately doped alloys of bismuth telluride or germanium-silicon. In a thermocouple pair of such elements, one element is of n-semi-conducting type and the other element is of p-semi-conducting type.

The present invention is based on the appreciation that in alloys, more especially germanium-silicon alloys, the concentration of boundaries at which scattering of phonons (where a phonon is a quantum of lattice vibrational energy) may occur has a significant effect on thermal conductivity. It has been appreciated that, in alloys, a significant proportion of thermal current is carried by low frequency phonons because the high frequency phonons are strongly scattered. Thus, scattering of low frequency phonons at boundaries can become important in comparison with other scattering effects, and has been found to be especially significant for germanium-silicon alloys at room temperature.

It is believed that factors which contribute to the significance of the effect of boundary scattering of low frequency phonons are the difference in mass between the elements of the alloy, which difference is comparatively large for germanium-silicon alloys, and the ratio between the Debye temperature and the operating temperature, which ratio is comparatively large for germanium-silicon alloys operating at room temperature.

Following this appreciation, it can be shown that thermal conductivity decreases with decrease in grain size of the germanium-silicon alloy and that a significant reduction in thermal conductivity can be achieved if the grain size is less than 10 microns. Theoretical considerations indicate that an element of the alloy $Ge_{10}Si_{30}$ having a substantially uniform grain size of 10 microns may be expected to have, at room temperature, a thermal conductivity approximately 20 per cent lower than the thermal conductivity of a single crystal of the alloy.

In practice, it has been found that, under certain conditions of manufacture, the alloy forms with an internal substructure within the grains so that there are boundaries of the substructure within the grain boundaries. Thus, where reference is made to the effect upon thermal conductivity of various limits of grain size, it may be more accurate to relate the effects to the concentration of phonon scattering boundaries and to refer to a characteristic scattering length rather than to grain size. Characteristic scattering length is defined as the reciprocal of the number of boundaries per unit length, where a boundary is the location of a change in crystal orientation. It is, however, believed that it is important to achieve a fine grain structure both for increasing the concentration of grain boundaries and for encouraging the formation of a substructure of boundaries within the grains.

Further, for thermoelectric alloys, it is important to avoid ambipolar conduction, that is thermal conduction by electron-hole pairs which have been lifted into the conduction energy band associated with the electrical conduction properties of semi-conductor material. In practice ambipolar conduction is avoided or reduced by heavy doping. For example, for many semi-conductor applications the dopant concentration may be of the order of 1 part in $10^7$ whereas for thermoelectric applications it is desirable to have a dopant concentration of the order of 1 part in 100 to reduce or avoid ambipolar conduction. A consequence of this is that electron-phonon scattering is increased in the heavily doped semi-conductor material and, if this is taken into account, the theoretically predicted percentage decrease in thermal conductivity with decrease in characteristic scattering length will be somewhat reduced.

Reduction in characteristic scattering length does not, on the other hand, have any significant effect upon the electrical conductivity or thermoelectric effect (Seebeck co-efficient) of the alloy, unless the characteristic scattering length is reduced to of the order of 0.01 microns or less.

Thus, for germanium-silicon alloys having a characteristic scattering length in the range 0.01 to 10 microns, the thermoelectric figure of merit will be a function of the characteristic scattering length, the thermoelectric figure of merit increasing with decreasing characteristic scattering length. If the characteristic scattering length is less than approximately 0.01 microns, the Seebeck co-efficient and electrical conductivity will decrease as well as the thermal conductivity thus producing a net decrease in the thermoelectric figure of merit. For characteristic scattering lengths above 10 microns, the decrease in thermal conductivity with decrease of characteristic scattering length is too small to be of practical significance in thermoelectric generators.

It will be appreciated that this 10 micron limit is not a sharply defined limit and represents a maximum characteristic scattering length at which, in germanium-silicon alloys, there can be detected a significant reduction in thermal conductivity as compared with that of a single crystal. For other alloys with, for example, less difference in mass between the components of the alloy, the corresponding limit would be less than 10 microns. It is believed, however, that the lower limit of 0.01 microns in characteristic scattering length, at which corresponding reductions in Seebeck coefficient and electrical conductivity set in, would be substantially the same for other semi-conducting alloys.

SUMMARY OF THE INVENTION

The invention provides a thermoelectric element comprising an alloy of germanium-silicon formed into a unitary structure substantially continuously constituted by the alloy and having a fine structure of lattice boundaries (as herein defined) for which the characteristic scattering length (as herein defined) lies in the range 0.01 microns to 10 microns.

Preferably the alloy comprises germanium-silicon, doped so as to have enhanced thermoelectric properties.

The invention also provides a thermoelectric element comprising an alloy of germanium and silicon, doped so as to have enhanced thermoelectric properties, the alloy being so formed as to have a fine grain structure in which, to reduce the thermal conductivity of the element below that of a single crystal of the alloy, at least a proportion of the grains have a size in the range 0.01 microns to 10 microns.

The invention includes a method of manufacturing thermoelectric elements comprising forming a powdered mixture of an alloy of suitable fundamental thermoelectric properties, hot pressing and cooling the mixture, the formation of the powdered mixture, the hot pressing and cooling steps being controlled so that, in order to reduce the thermal conductivity of the element below that of a single crystal of the alloy, a solid element is formed with a fine structure of lattice boundaries for which the characteristic scattering length lies in the range 0.01 microns to 10 microns.

The invention also includes a method of manufacturing thermoelectric elements comprising forming a powdered mixture of germanium and silicon and a dopant in proportions appropriate for forming a germanium-silicon alloy doped so as to have enhanced thermoelectric properties, hot pressing and cooling the powder so that it forms a fine grained solid thermoelectric element, the formation of the powdered mixture and the hot pressing steps being so controlled that, to reduce the thermal conductivity of the element below that of a single crystal of the alloy, at least a proportion of the grains have a size in the range 0.01 microns to 10 microns.

In one method according to the invention the powdered mixture is formed by first forming an alloy of germanium and silicon, doped so as to have enchanced thermoelectric properties, and milling the alloy until a powder is produced.

DESCRIPTION OF PREFERRED EMBODIMENT

A specific composition of thermoelectric element and method for its manufacture embodying the invention will now be described by way of example and with reference to the accompanying drawing, which is a diagrammatic sectional view illustrating hot pressing apparatus.

In this example, a homogeneous alloy of germanium-silicon, preferably having between 60 and 85 percent silicon, is initially formed by melting and shaking in vacuum and finally quenching or chill casting. The alloy is heavily doped with phosphorus if it is to be n-type or with boron if it is to be p-type.

The quenched or chill cast alloy is then bulk milled, either dry or in an inert atmosphere or wet in xylene, for long enough to produce a powder having a particle size in the range 0.1 micron to 10 microns. The milling time required may be of the order of 3 to 5 days, although the required particle size can be produced with a circulating vibratory mill in times of the order of ½ to 1 hour.

A further method of reducing the particle size to the order of 0.6 microns is to inject particles, after initial formation by bulk milling, into a microniser gas mill. In a gas mill, gas carrying the particles is injected tangentially into a cylindrical vessel with an axially located outlet. The gas circulates and larger particles remain close to the periphery of the vessel whilst fine particles can drift to the axial outlet. A suitable arrangement for an oppositely directed tangential gas stream also carrying particles gives rise to collisions between the larger particles on the periphery, thereby breaking down the large particles.

The powder is hot pressed at temperatures up to 1,350°C and pressures up to 30 Meganewtons per square metre (2 tons per square inch). Referring to the drawing, an apparatus for performing this hot pressing comprises a hollow cylindrical graphite die 11, within which the germanium-silicon powder is located at 12. Pressure is applied by opposed cylindrical graphite punches 13, 14. The die and punches are surrounded by an alumina insulation 15 which is contained within a hollow cylindrical wall 16. The wall 16 supports an r.f. heating coil 17 for raising the temperature of the powder 12.

It is important to avoid grain growth during the hot pressing process. Provided that the pressing time is short, that is of the order of 3–7 minutes, then the final grain size is only slightly different from the initial particle size of the powder. Pressing times of the order of 20 minutes have, however, been employed without deleterious grain growth during pressing.

The size distribution of the grains depends upon the milling process and apparatus.

The formation of a substructure within the grains, as discussed above, appears to depend additionally upon the thermal cycle which should be comparatively fast. Typically, the powder should be heated from ambient to 1,300°C or 1,350°C in about 15 minutes, under the pressure of 30 $MNm^{-2}$ (2 tons per square inch), held for about 2 to 5 minutes and then cooled to ambient temperature in 20 to 30 minutes.

Under these conditions, elements have been formed with characteristic scattering lengths of the order of 0.5 microns.

It will be appreciated, to have reduced thermal conductivity, a thermoelectric element need not necessarily wholly comprise grains in the size range 0.01 to 10 microns, or grains within which the characteristic scattering length is in the range 0.01 to 10 microns. If a proportion of the grains are in this size range, or have this characteristic scattering length, then the reduction in thermal conductivity of the element will be expected to correspond to the proportion and the average size of grains in the range which are present.

An alternative procedure for forming the initial fine powder to be hot pressed is by gas deposition. Thus, for example, if silicon tetrachloride and germanium tetrachloride mixed in the appropriate proportions are introduced into a hot reaction cell, germanium-silicon deposits as a fine powder.

It is believed that germanium-silicon alloy with the desired grain size may alternatively be produced by permitting the alloy to solidify in the presence of acoustic waves. Waves of the appropriate frequency, for example of the order of $5 \times 10^8$ to $5 \times 10^{11}$ Hz, would induce density fluctuations encouraging nucleation on the required scale. A further alternative envisaged is a growth process in which amounts of liquid material between $10^{-18}$ and $10^{-9}$ cu. cms. at a time are caused to solidify on a growing ingot. This could be effected by building up the material by plasma spraying or a drip feed process.

I claim:

1. A thermoelectric element comprising an alloy of germanium-silicon formed into a unitary structure substantially continuously constituted by the alloy and having a fine structure of lattice boundaries for which the characteristic scattering length lies in the range 0.01 microns to 10 microns.

2. A thermoelectric element as claimed in claim 1 wherein the alloy is doped so as to have enhanced thermoelectric properties.

3. A thermoelectric element consisting of germanium-silicon alloy and a dopant for enhancing the thermoelectric properties thereof, the alloy having a fine structure of lattice boundaries for which the characteristic scattering length lies in the range of 0.01 microns to 10 microns.

4. A thermoelectric element comprising an alloy of germanium and silicon, doped so as to have enhanced thermoelectric properties, and formed into a unitary structure substantially continuously constituted by the alloy and having a fine grain structure in which, to reduce the thermal conductivity of the element below that of a single crystal of the alloy, at least a bulk proportion of the grains have a size in the range 0.01 microns to 10 microns.

* * * * *